United States Patent
Sano et al.

(10) Patent No.: US 6,413,794 B1
(45) Date of Patent: Jul. 2, 2002

(54) METHOD OF FORMING PHOTOVOLTAIC ELEMENT

(75) Inventors: Hitomi Sano, Kyoto; Masahiro Kanai, Tokyo; Hideo Tamura, Nara, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/649,599

(22) Filed: Aug. 29, 2000

(30) Foreign Application Priority Data

Aug. 30, 1999 (JP) ............................................ 11-243452

(51) Int. Cl.$^7$ ............................................. H01L 21/00
(52) U.S. Cl. ....................................................... 438/96
(58) Field of Search ............................. 438/48, 57, 61, 438/62, 69, 71, 72, 96, 97, 795; 136/252, 256, 258, 261

(56) References Cited

U.S. PATENT DOCUMENTS

| | | | |
|---|---|---|---|
| 5,136,351 A | 8/1992 | Inoue et al. | 357/30 |
| 5,668,050 A * | 9/1997 | Iwasaki et al. | 438/69 |
| 5,824,566 A | 10/1998 | Sano et al. | 438/69 |

FOREIGN PATENT DOCUMENTS

| | | |
|---|---|---|
| JP | 4-218977 | 8/1992 |
| JP | 6-116722 | 4/1994 |
| JP | 9-92857 | 4/1997 |

* cited by examiner

*Primary Examiner*—Keith Christianson
(74) *Attorney, Agent, or Firm*—Fitzpatrick, Cella, Harper & Scinto

(57) ABSTRACT

A method of forming a photovoltaic element according to the present invention comprises at least the steps of depositing a metal layer on a supporting member, depositing a metal oxide layer on the above metal layer, and arranging at least one or more pin structures, each of which is formed by stacking the predetermined n-type, i-type and p-type semiconductor layers, on a substrate formed by stacking on the above supporting member, the above metal layer and the above metal oxide layer in this order, wherein a step of subjecting the supporting member having the metal layer formed thereon to heat treatment is carried out between the two steps of depositing the above metal layer and depositing the above metal oxide layer. Accordingly, the present invention provides a method of forming a photovoltaic element which enables the solution of the problem that defective portions appear in a semiconductor layer because the semiconductor layer, which functions as a photoelectric converting layer, formed on irregularities of a metal layer surface cannot fully cover the metal layer due to the existence of projecting portions or portions with great height difference on a part of the irregularities.

8 Claims, 6 Drawing Sheets

METHOD OF FORMING PHOTOVOLTAIC ELEMENT

BACKGROUND OF THE INVENTION

1. Field of the Invention

The present invention relates to a method of forming a photovoltaic element. In particular, the present invention relates to a method of forming a photovoltaic element which enables the solution of the problem caused by irregularities formed on a metal layer surface of a photovoltaic element, in other words, the problem of defective portions appearing in a photovoltaic element because the photoelectric converting layer formed on the irregularities of the metal layer surface cannot fully cover the metal layer due to the existence of projecting portions or portions with great height difference in a part of the irregularities. The present invention is suitably applied particularly when forming photovoltaic elements such as solar cells and sensors utilizing non-single-crystalline semiconductors such as of amorphous silicon, microcrystalline silicon, amorphous silicon-germanium alloy and polycrystalline silicon.

2. Related Background Art

In photovoltaic elements for use in solar cells etc., their metal layers and metal oxide layers, which are provided under semiconductor layers functioning as photoelectric converting layers, have been devised in various ways in order to effectively utilize the light with which the photovoltaic elements are illuminated. In Japanese Patent Application Laid-Open No. 4-218977, for example, there is disclosed a technique in which reflection at a light reflection layer is improved by depositing a discontinuous metal layer having irregularities thereon and a continuous metal oxide layer of a uniform thickness on the above metal layer. However, in order to improve the photoelectric conversion factor (efficiency) of the photovoltaic element, further improvement in reflection is desired.

In Japanese Patent Application laid-Open No. 6-116722, there is disclosed a method of forming metal layers and transparent electrode layers continuously by the sputtering method while moving a long substrate (generally referred to as Roll to Roll method). With a system for forming such layers to which this method is applicable, devices can be formed continuously without stopping the system for hours, thereby high productivity can be obtained.

In Japanese Patent Application Laid-Open No. 9-92857, there is disclosed a method of forming a satisfactory photovoltaic element in which a reflection layer is deposited on a supporting member, the supporting member with the reflection layer is cooled to 100° C. or lower before stacking a reflection increasing layer thereon, so as to control oxidation of the reflection layer surface and improve the films closely touching with each other.

In the methods of forming a photovoltaic element according to the prior arts, when continuing deposition for hours, a problem as described below arises, due to a change in depositing conditions with time, which makes it hard to obtain a photovoltaic element with high reliability and stable performance.

As one of the methods of forming thin films such as a metal layer, the sputtering method is used in which a high energy is applied to a bulk material to form its particles and the particles are deposited on a supporting member to form a thin film. In this case, however, the deposited particles lose most of their energy in an instant; accordingly, thin films are often formed in an instance before they reach thermal equilibrium by this method.

On the other hand, a metal layer provided under a semiconductor layer functioning as a photoelectric converting layer can effectively reflect the light having transmitted the photoelectric converting layer if its surface has irregularities. As described above, however, since the metal layer is formed before its particles reach thermal equilibrium, there are likely to exist remarkably projecting portions or portions with great height difference between the concavities and convexities in a part of the irregularities; as a result, defective portions may be generated because, for example, the photoelectric converting layer formed on the irregularities cannot fully cover the metal layer. In such a photovoltaic element formed on a supporting member, there has been a problem of short-circuit current being generated at the defective portions.

SUMMARY OF THE INVENTION

Accordingly, the object of the present invention is to provide a method of forming a photovoltaic element which enables the solution of the problem caused by the irregularities formed on a metal layer surface of a photovoltaic element, in other words, the problem of defective portions appearing in the photovoltaic element because a semiconductor layer formed on the irregularities of the metal layer surface and functioning as a photoelectric converting layer cannot fully cover the metal layer due to the existence of remarkably projecting portions or portions with great height difference in a part of the irregularities. As a result, the present invention provides a method for stably forming a photovoltaic element of high quality, good uniformity, and high reproductivity which produces less defects and causes no short circuit in the current flow generated on the semiconductor layer.

The method of forming a photovoltaic element according to the present invention comprises at least the steps of: depositing a metal layer on a supporting member; depositing a metal oxide layer on the above metal layer; and arranging at least one or more pin structures, which is formed by stacking n-type, i-type and p-type silicon-containing non-single-crystalline semiconductor layers, on a substrate formed by stacking the metal layer and the metal oxide layer on the above supporting member, wherein a step of subjecting the supporting member having the above metal layer formed thereon to heat treatment is carried out between the step of depositing the above metal layer and the step of depositing the above metal oxide layer.

Providing the step of subjecting the supporting member having the above metal layer formed thereon to heat treatment restricts the generation of the projections and the great height difference in a part of the irregularities formed on the surface of the metal layer; therefore, a semiconductor layer formed on the irregularities and functioning as a photoelectric converting layer can fully cover the metal layer. As a result, defective portions appearing on the semiconductor layer are decreased, which enables the stable formation of a photovoltaic element which does not cause short circuit in the current flow generated on the semiconductor layer.

The above heat treatment step is preferably a step in which cooling treatment, heating treatment and cooling treatment are carried out once or repeated plural times in this order.

In the above, the temperature decreasing speed of the supporting member in the above cooling treatment is preferably 1° C./sec or higher and 50° C./sec or lower, the temperature increasing speed of the supporting member in the above heating treatment is desirably 10° C./sec or higher and 100° C./sec or lower, and the temperature for heating the supporting member in the above heating treatment is suitably 100° C. or higher and 400° C. or lower.

DESCRIPTION OF PREFERRED EMBODIMENTS

The method of forming photovoltaic elements according to the present invention and the action of the photovoltaic elements will be described below with reference to the accompanying drawings.

Photovoltaic Element

Figure 1:
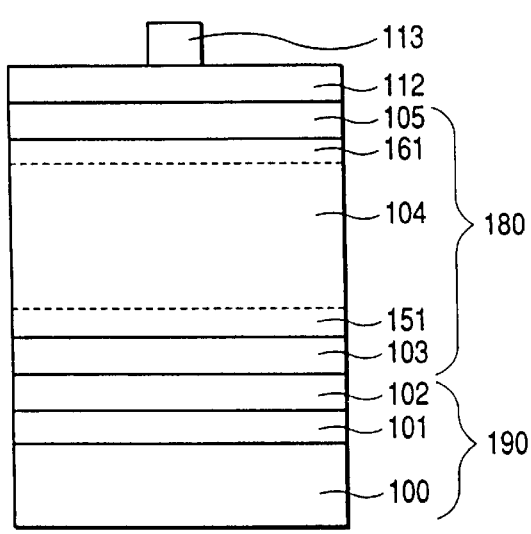
FIG. 1 is a schematic sectional view of one example of the single type photovoltaic element according to the present invention.
Figure 2:
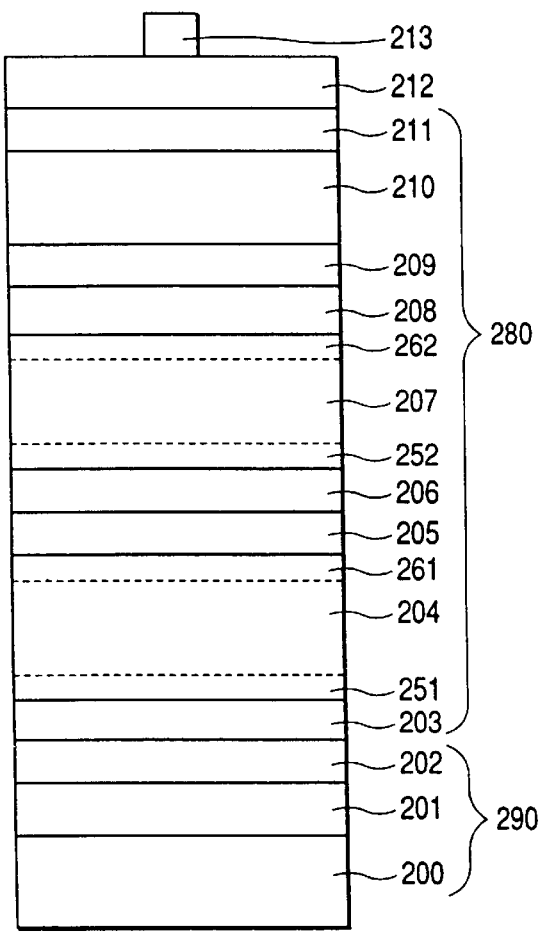
FIG. 2 is a schematic sectional view of one example of the triple type photovoltaic element according to the present invention.

The photovoltaic elements formed by the method according to the present invention include, for example, those shown in FIGS. 1 and 2. FIG. 1 is a schematic sectional view of one example of the photovoltaic elements having a single pin structure, and FIG. 2 is a schematic sectional view of one example of the photovoltaic elements having three pin structures. The photovoltaic elements will be described in detail based on FIGS. 1 and 2.

FIG. 1 is a schematic sectional view of one example of the photovoltaic elements having a single pin structure. The photovoltaic elements having a single pin structure are divided into two types: one type in which irradiation of light is carried out from the side opposite to a substrate and the other type in which irradiation of light is carried out from the substrate side.

One example of the photovoltaic elements in which irradiation of light is carried out from the side opposite to a substrate consists of a substrate 190 consisting of a supporting member 100, a metal layer 101 and a metal oxide layer 102; a first n-type layer (or p-type layer) 103; n/i (or p/i) buffer layer 151; a first i-type layer 104; an i/p (or i/n) buffer layer 161; a first p-type layer (or n-type layer) 105; a transparent electrode 112; and a current collecting electrode 113, in a bottom-to-top order. The constitution of one example of the photovoltaic elements in which irradiation of light is carried out from the substrate side is the same as the above example, except that the supporting member 100, the metal layer 101, the metal oxide layer 102 and the transparent electrode 112 are replaced with a translucent supporting member, a transparent electro-conductive layer, an antireflection layer and an electro-conductive layer also serving as a light reflection layer, respectively.

FIG. 2 is a schematic sectional view of one example of the photovoltaic elements having three pin structures. The photovoltaic elements having three pin structures are also divided into two types: one type in which irradiation of light is carried out from the side opposite to a substrate and the other type in which irradiation of light is carried out from the substrate side.

One example of the photovoltaic elements having three pin structures in which irradiation of light is carried out from the side opposite to a substrate consists of a substrate 290 consisting of a supporting member 200, a metal layer 201 and a metal oxide layer 202; a first n-type layer (or p-type layer) 203; n/i (or p/i) buffer layer 251; a first i-type layer 204; an i/p (or i/n) buffer layer 261; a first p-type layer (or n-type layer) 205; a second n-type layer (or p-type layer) 206; n/i (or p/i) buffer layer 252; a second i-type layer 207; an i/p (or i/n) buffer layer 262; a second p-type layer (or n-type layer) 208; a third n-type layer (or p-type layer) 209; a third i-type layer 210; a third p-type layer (or n-type layer) 211; a transparent electrode 212; and a current collecting electrode 213, in a bottom-to-top order.

The constitution of one example of the photovoltaic elements having three pin structures in which irradiation of light is carried out from the substrate side is the same as the above example, except that the supporting member 200, the metal layer 201, the metal oxide layer 202 and the transparent electrode 212 are replaced with a translucent supporting member, a transparent electro-conductive layer, an antireflection layer and an electro-conductive layer also serving as a light reflection layer, respectively.

Apparatus and Method for forming Metal Layer and Metal Oxide Layer

Figure 3:
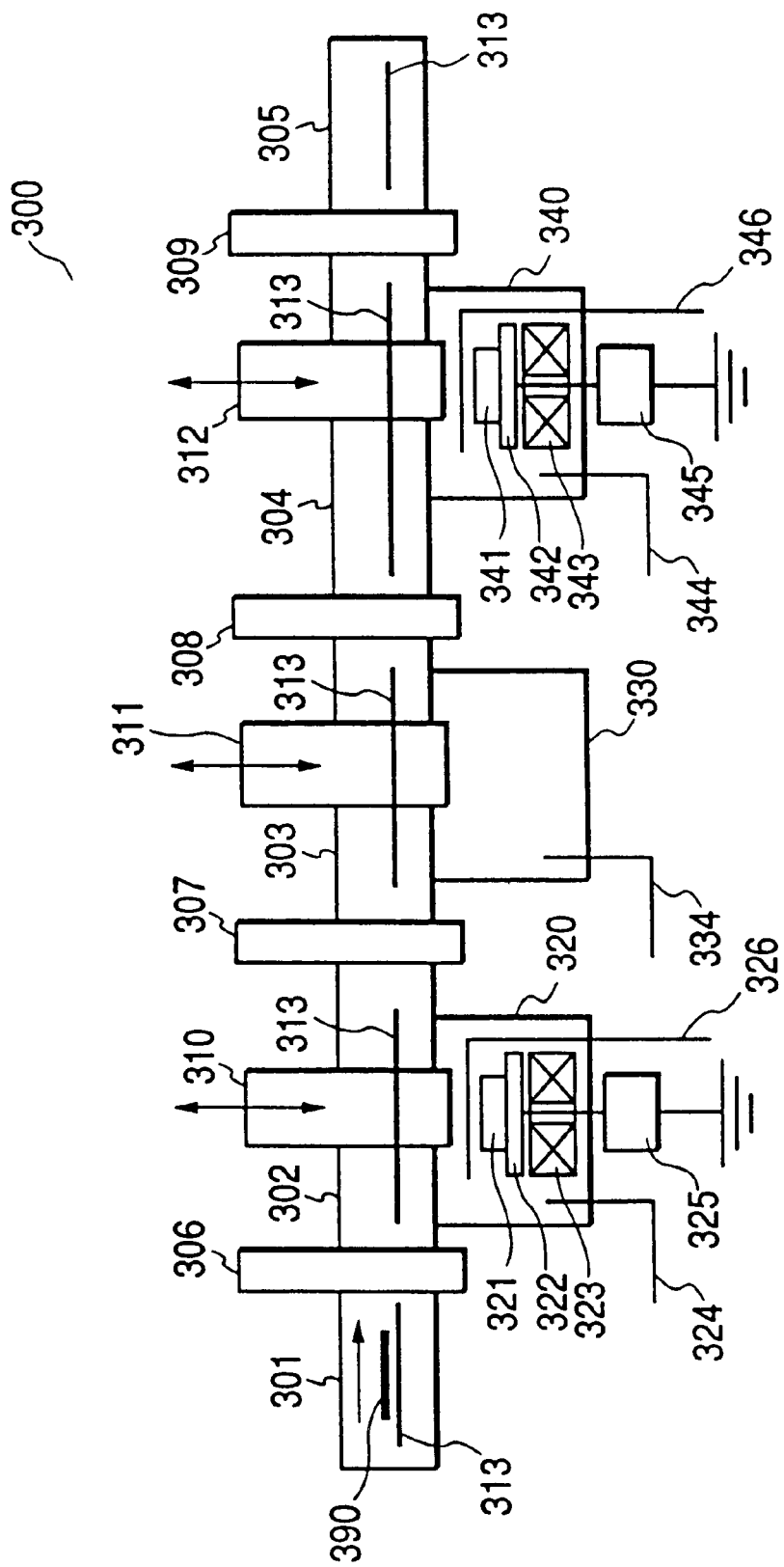
FIG. 3 is a schematic sectional view of one example of the system, the multi-chamber separation type system, for forming a metal layer and a metal oxide layer both constituting a substrate for a photovoltaic element according to the present invention.
Figure 6:
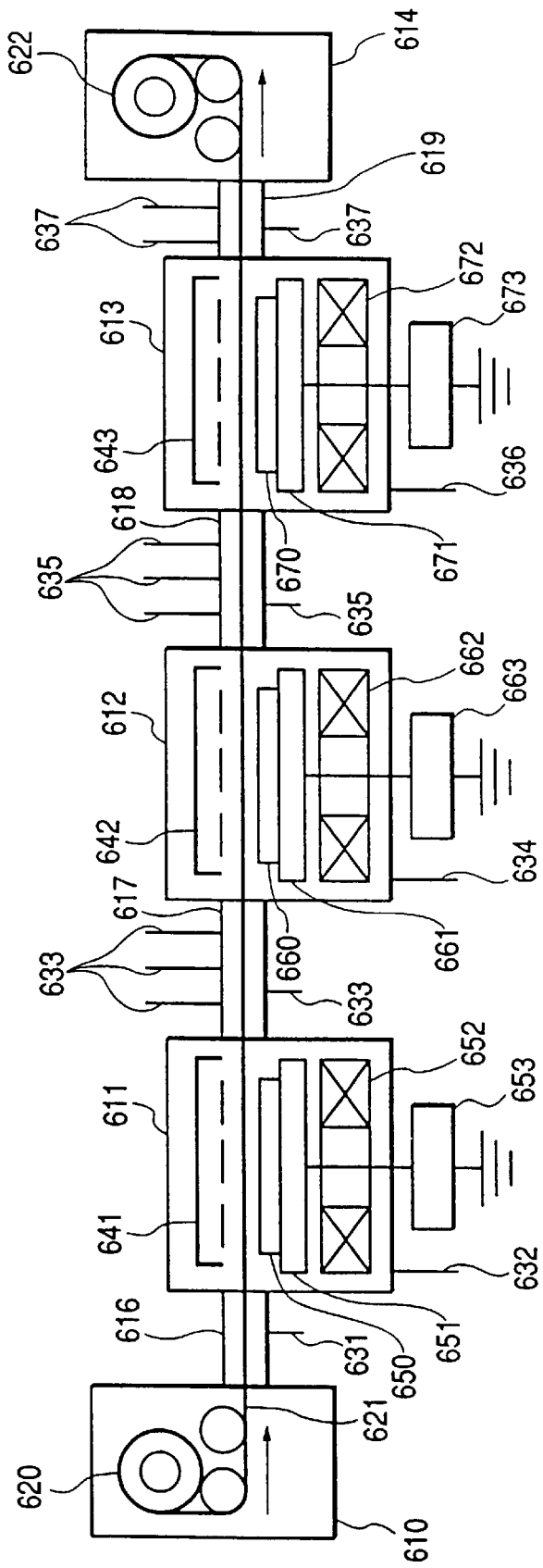
FIG. 6 is a schematic sectional view of another example of the system, the Roll to Roll type system, for forming a metal layer and a metal oxide layer which constitute a substrate for a photovoltaic element according to the present invention.

The apparatus for forming a metal layer and a metal oxide layer of the photovoltaic elements according to the present invention include, for example, those shown in FIGS. 3 and 6. FIG. 3 and FIG. 6 are schematic sectional views of one example of the formation apparatus of the multi-chamber separation type system and one example of the formation apparatus of the Roll to Roll type system, respectively. Hereinafter a lamination of a metal layer and a metal oxide layer shall be referred to as light reflection layer.

The formation apparatus of the multi-chamber separation type system shown in FIG. 3 will be described below.

The formation apparatus of the multi-chamber separation type system 300 consists of a load-lock chamber 301, transportation chambers 302, 303 and 304, an unload chamber 305, gate valves 306, 307, 308 and 309, heaters 310, 311 and 312 for heating a supporting member, a supporting member transporting rail 313, a metal layer deposition chamber 320, a heat treatment chamber 330, a metal oxide layer deposition chamber 340, target electrodes 322 and 342, gas feed pipes 324, 334 and 344, sputtering power sources 325 and 345, target shutters 326 and 346. On the target electrodes 322 and 342 targets 321 and 341 are arranged, respectively, and on the rail 313 for transporting a supporting member a supporting member 390 is arranged.

To the apparatus for forming metal layers and metal oxide layers shown in FIG. 3, raw material gas supplying systems (not shown in the figure) are connected via gas feed pipes. To the respective raw material gas supplying apparatus, cylinders each containing for ultrapure hydrogen gas, argon gas and helium gas are connected. And as the target 321 a metal for the metal layer is arranged, and as the target 341 a metal oxide for the metal oxide layer is arranged.

Then one example of the methods of forming metal layers and metal oxide layers will be described with reference to the formation apparatus of the multi-chamber separation type system shown in FIG. 3. The numerals in parentheses denote the procedure for forming a metal layer and a metal oxide layers.

(1) The supporting member is subjected to ultrasonic cleaning with acetone and isopropanol and warm-air drying. The supporting member having been subjected to ultrasonic cleaning is arranged on the supporting member transporting rail 313 in the load chamber 301, and the load chamber 301 is subjected to evacuation to about $1\times10^{-5}$ Torr with a vacuum pump not shown in the figure.

(2) The supporting member is transported into the transportation chamber 302 and the deposition chamber 320, which has been previously evacuated with a vacuum pump not shown in the figure, by opening the gate valve 306 The supporting member 390 is heated at a temperature increasing speed of 10 to 100° C./sec, while the backside of the supporting member 390 and the heater 310 for heating the supporting member closely touching with each other, the temperature of the supporting member is set to 200° C. to 500° C., and the deposition chamber 320 is evacuated to a pressure of about $3\times10^{-4}$ Torr with a vacuum pump not shown in the figure.

(3) Ar gas is introduced into the deposition chamber 320 through the gas feed pipe 324 at a desired flow rate, the pressure is controlled to become 1 to 30 mTorr with a conductance valve not shown in the figure, an electric current is passed through a toroidal coil 323, and 100 to 1000 V of DC power is applied from the sputtering power source 325, so as to generate Ar plasma.

(4) The target shutter 326 is opened so as to form a metal layer 101 consisting of Ag on the surface of a stainless steal plate, and the same shutter is closed once the metal layer 101 becomes 0.25 to 1 $\mu$m thick, so as to extinguish the plasma.

(5) The heater 310 for heating the supporting member is moved up, and after the supporting member is cooled in the atmosphere of He gas, as a cooling gas, at a temperature decreasing speed of 1 to 50° C./sec to 100° C. or lower, the supporting member is transported into the transportation chamber 303 and the deposition chamber 330, which has been evacuated with a vacuum pump not shown in the figure previously, by opening the gate valve 307.

(6) The supporting member 390 is heated at a temperature increasing speed of 10 to 100° C./sec, while the backside of the supporting member 390 and the heater 311 for heating the supporting member closely touching with each other, the temperature of the supporting member is set to 100 to 400° C. and the pressure of the deposition chamber 330 is controlled with a vacuum pump not shown in the figure via a conductance valve not shown in the figure so as to become about 1 to 30 mTorr, and the metal layer is treated by heating. At this point, an inert gas, for example, hydrogen gas, argon gas or helium gas may be fed through the gas feed pipe 334. In this case, heating is carried out at a constant temperature at least for 1 minute or longer.

(7) The heater 311 for heating the supporting member is moved up, and after the supporting member is cooled in the atmosphere of He gas, as a cooling gas, at a temperature decreasing speed of 1 to 50° C./sec to 100° C. or lower, the supporting member is transported into the transportation chamber 304 and the deposition chamber 340, which has been evacuated with a vacuum pump not shown in the figure previously, by opening the gate valve 308.

(8) The supporting member 390 Is heated at a temperature increasing speed of 10 to 100° C./sec, while the backside of the supporting member 390 and the heater 312 for heating the supporting member closely touching with each other, the temperature of the supporting member is set to 290° C. and then the deposition chamber 340 is evacuated with a vacuum pump not shown in the figure to about $2\times10^{-5}$ Torr.

(9) Ar gas is introduced into the deposition chamber 340 through the gas feed pipe 344 at a desired flow rate, the pressure is controlled to become 6 mTorr with a conductance valve not shown in the figure, an electric current is passed through a toroidal coil 343, and 100 to 1000 V of DC power is applied from the sputtering power source 345, so as to generate Ar plasma.

(10) The target shutter 346 is opened so as to form a metal oxide layer 102 on the surface of the metal layer 101 consisting of Ag, and the same shutter is closed once the metal oxide layer 102 becomes 0.05 to 4 $\mu$m thick, so as to extinguish the plasma.

(11) The heater 312 for heating the supporting member is moved up, and after the supporting member is cooled in the atmosphere of He gas, as a cooling gas, at a temperature decreasing speed of 1 to 50° C./sec to 100° C. or lower, the supporting member is transported into the unload chamber 305, which has been evacuated with a vacuum pump not shown in the figure previously, by opening the gate valve 309. Thus metal layer and metal oxide layer according to the present invention are formed.

The apparatus of the Roll to Roll type system for forming a metal layer and a metal oxide layer shown in FIG. 6 will be described below. The formation apparatus 600 consists of a substrate feed chamber 610, a plurality of deposition chambers 611 to 613 and a substrate winding chamber 614 all of which are connected to each other in sequence via separation passages 616, 617, 618 and 619, and each deposition chamber has an outlet through which the chamber can be evacuated.

Then the method of forming a metal layer and a metal oxide layer by using the formation apparatus of the Roll to Roll type system shown in FIG. 6 will be described.

A strip supporting member 621 is transported from the substrate feed chamber 610 toward the substrate winding chamber 614 through each deposition chamber and each separation passage. During this transportation, predetermined metal and metal oxide layers are formed on the strip supporting member 621, which is moving, by introducing gas from gas inlets in each deposition chamber and each separate passage and exhausting the gas from each outlet.

In the deposition chamber 611 a metal layer consisting of Ag is formed, and in the deposition chamber 613 a metal oxide layer consisting of ZnO is. formed. In the deposition chamber 612 deposition is not carried out and the chamber 612 is used as a heat treatment chamber. Inside each deposition chamber, lamp heaters 641, 642 and 643 for heating the substrate from its backside are installed, so that the strip supporting member is heated to a predetermined temperature. The separation passages 616, 617, 618 and 619 have a temperature decreasing function of the present invention.

In the deposition chamber 611, a metal layer consisting of Ag is formed on the strip supporting member 621 by introducing Ar gas etc. through a gas inlet 632 and using a metal for a target 650, in accordance with the DC magnetron sputtering method.

Then, the supporting member having a metal layer formed thereon is subjected to cooling treatment with an atmospheric gas in the separation passage 617, subjected to heating treatment by introducing Ar gas through a gas inlet 634 in the heat treatment chamber 612, and again subjected to cooling treatment with an atmospheric gas in the separation passage 618.

In the deposition chamber 613, a metal oxide layer consisting of ZnO is formed on the metal layer consisting of Ag by introducing Ar gas eta. through a gas inlet 636 and using a metal oxide for a target 670, in accordance with the DC magnetron sputtering method or RF magnetron sputtering method.

The strip supporting member 621 having the metal layer and metal oxide layer according to the present invention formed thereon under predetermined conditions is wound up into the substrate winding chamber 614.

Apparatus for and Method of forming Semiconductor Layer

Figure 4:
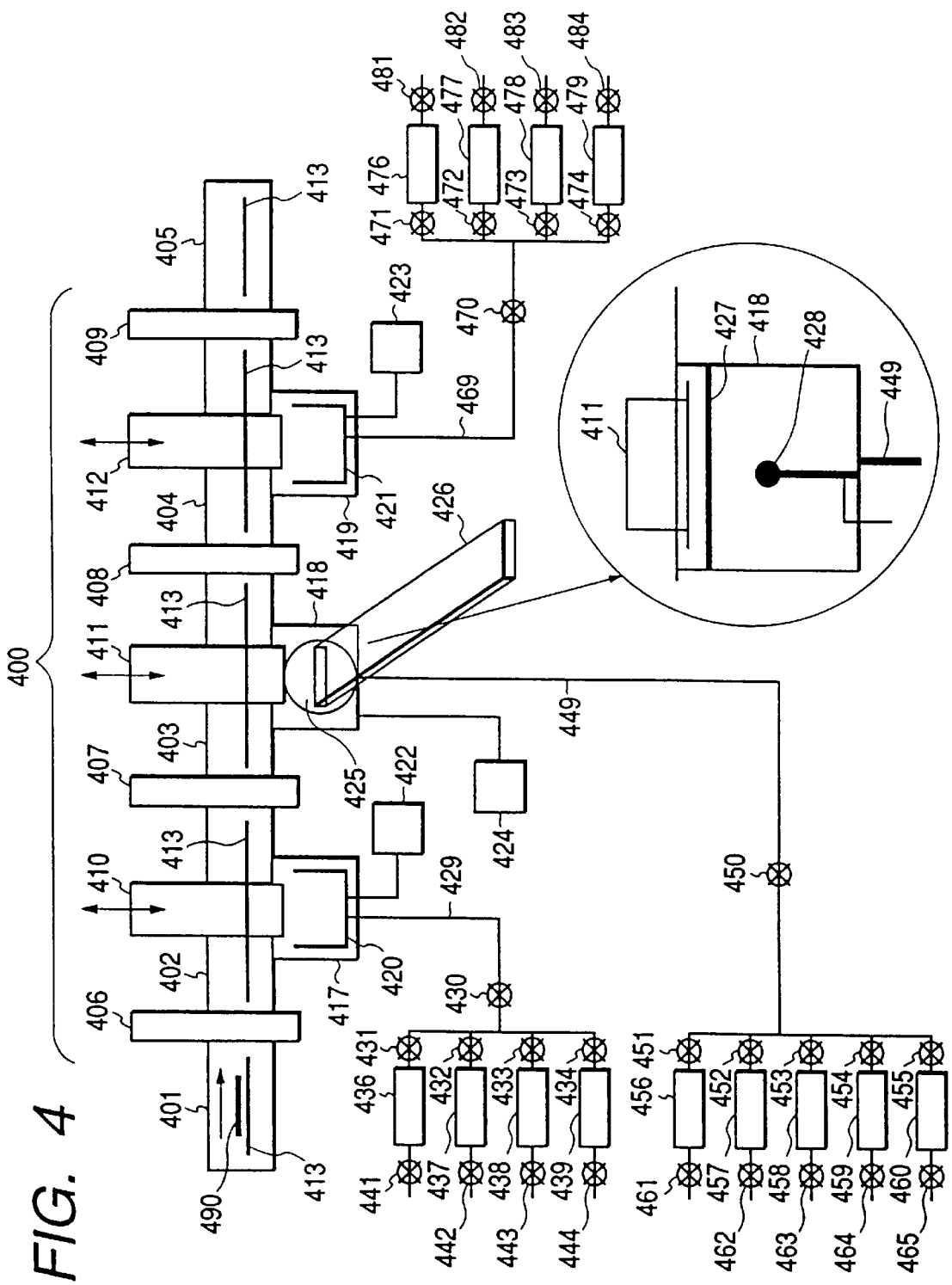
FIG. 4 is a schematic sectional view of one example of the system, the multi-chamber separation type system, for forming semiconductor layers constituting a pin structure according to the present invention.
Figure 5:
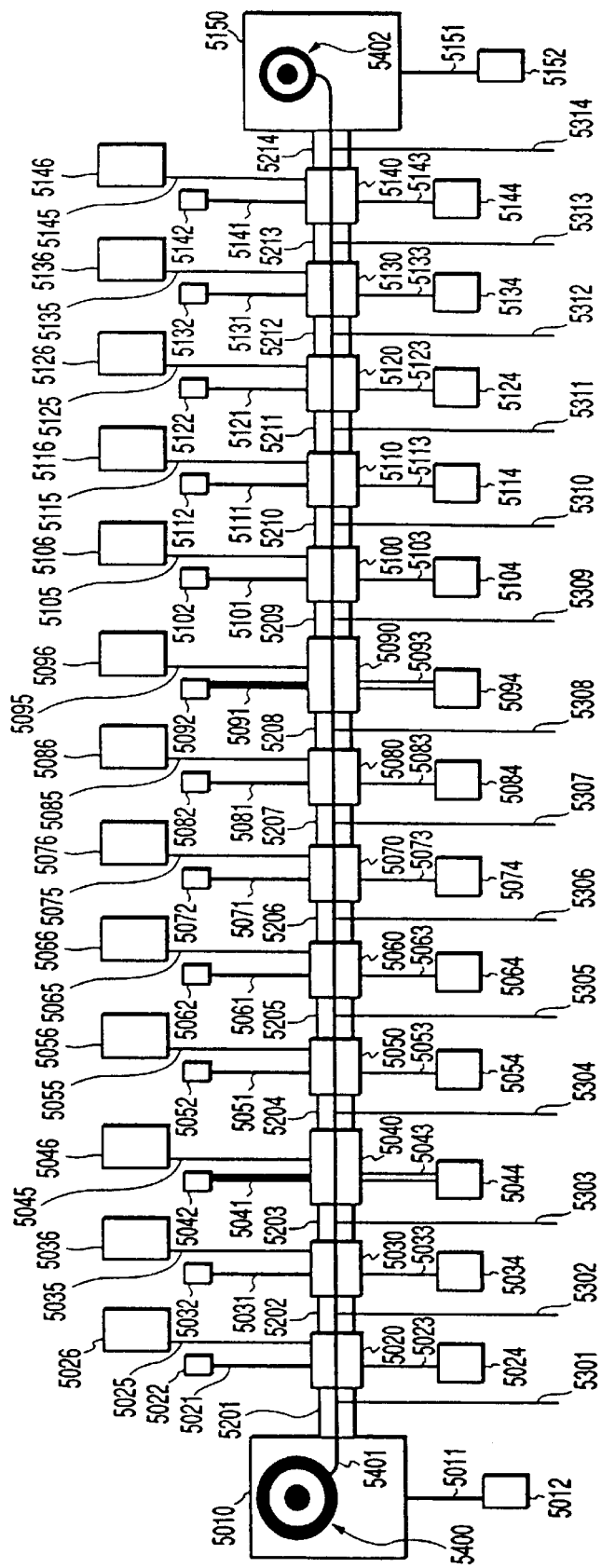
FIG. 5 is a schematic sectional view of another example of the system, the Roll to Roll type system, for forming semiconductor layers constituting a pin structure according to the present invention.

The apparatus according to the present invention for forming semiconductor layers constituting a pin structure include, for example, those shown in FIGS. 4 and 5. FIGS. 4 and 5 are schematic sectional views of one example of the formation apparatus of the multi-chamber separation type system and one example of the formation apparatus of the Roll to Roll type system, respectively.

Now the formation apparatus of the multi-chamber separation type system shown in FIG. 4 will be described. The formation apparatus 400 shown in FIG. 4 consists of a load chamber 401, transportation chambers 402, 403 and 404, an unload chamber 405, gate valves 406, 407, 408 and 409, heaters 410, 411 and 412 for heating a substrate, a substrate transporting rail 413, an n-type layer (or p-type layer) deposition camber 417, an i-type layer deposition chamber 418, a p-type layer (or n-type layer) deposition camber 419, cups 420 and 421 for generating plasma, power sources 422, 423 and 424, a microwave introducing window 425, a waveguide 426, gas feed pipes 429, 449 and 469, valves 430, 431, 432, 433, 434, 441, 442, 443, 444, 450, 451, 452, 453, 454, 455, 461, 462, 463, 464, 465, 470, 471, 472, 473, 474, 481, 482, 482 and 484, mass flow controllers 436, 437, 438, 439, 456, 457, 458, 459, 460, 476, 477, 478 and 479, a shutter 427, a bias rod 428, a substrate holder 490, an exhaust system not shown in the figure, a microwave power source not shown in the figure, a vacuum gauge not shown in the figure, and a controller not shown in the figure.

The formation apparatus of the Roll to Roll type system shown in FIG. 5 will be described below. The formation apparatus 5000 shown in FIG. 5 consists of a load chamber 5010 for introducing a sheet substrate, an unload chamber 5150, and 13 deposition chambers consisting of a first n-type layer deposition chamber 5020, a first RF-i layer (n/i) deposition chamber 5030, a first MW-i layer deposition chamber 5040, a first RF-i layer (p/i) deposition chamber 5050, a first p-layer deposition chamber 5060, a second n-type layer deposition chamber 5070, a second RF-i layer (n/i) deposition chamber 5080, a second MW-i layer deposition chamber 5090, a second RF-i layer (p/i) deposition chamber 5100, a second p-type layer deposition chamber 5110, a third n-type layer deposition chamber 5120, a third RF-i layer (f/i) deposition chamber 5130 and a third p-type layer deposition chamber 5140 all of which are connected to each other in sequence between the above load chamber 5010 and the unload chamber 5150.

Between the adjacent chambers, all of which constitute the apparatus 5000 for forming semiconductor layers shown in FIG. 5, there are provided gas gates (5201, 5202, 5203, 5204, 5205, 5206, 5207, 5208, 5209, 5210, 5211, 5212, 5213 and 5214) via which the above chambers are connected in sequence. And for the respective gas gates provided are gas feed pipes (5301, 5302, 5303, 5304, 5305, 5306, 5307, 5308, 5309, 5310, 5311, 5312, 5313 and 5314) for feeding gas thereto. For the load chamber 5010, the unload chamber 5150 and the respective deposition chambers exhaust pumps (5012, 5022, 5032, 5042, 5052, 5062, 5072, 5082, 5092, 5102, 5112, 5122, 5132, 5142 and 5152) are provided via exhaust pipes (5011, 5021, 5031, 5041, 5051, 5061, 5071, 5081, 5091, 5101, 5111, 5121, 5131, 5141 and 5151).

For the respective deposition chambers all of which constitute the apparatus 5000 shown in FIG. 5, mixing apparatuses (5026, 5036, 5046, 5056, 5066, 5076, 5086, 5096, 5106, 5116, 5126, 5136 and 5146) are provided via raw material gas supplying pipes (5025, 5035, 5045, 5055, 5065, 5075, 5085, 5095, 5105, 5115, 5125, 5135 and 5145). And for the respective deposition chambers, radio-frequency (hereinafter referred to as "RF") power supplies (5024, 5034, 5044, 5054, 5064, 5074, 5084, 5094, 5104, 5114, 5124, 5134 and 5144) are provided via RF supplying coaxial cables (5023, 5033, 5043, 5053, 5063, 5073, 5083, 5103, 5113, 5123, 5133 and 5143).

In the load chamber 5010 and the unload chamber 5150, a sheet delivery jig 5400 and a sheet winding jig 5402 are provided, respectively, in such a manner that a sheet substrate 5401 delivered from the sheet delivery jig 5400 passes through the aforementioned 13 deposition chambers and is wound by the sheet winding jig 5402.

Further, to each of the first and second MW-i layer deposition chambers 5040 and 5090, a coaxial cable for applying bias, a power source and an exhaust gas treating apparatus not shown in the figure are connected.

Supporting Member

The materials used for the supporting member according to the present invention are preferably such that they cause less deformation and distortion at the temperature required for the formation of a photovoltaic element, have a desired strength, and are electrically conductive. Further, the supporting member is preferably such that, even after being subjected to hydrogen plasma treatment, which is carried out after deposition of a metal layer and a metal oxide layer, it can remain closely touching the metal layer and the metal oxide layer.

In particular, the preferable materials include, for example, thin films of stainless steel, aluminum and Its alloys, iron and its alloys, and copper and its alloys; the composites thereof; the materials obtained by subjecting the above thin films and composite materials to surface coating with metal thin films of different materials and/or with insulating thin films of $SiO_2$, $Si_3N_4$, $Al_2O_3$, AlN, etc. by the methods such as sputtering, evaporating and plating; the materials obtained by subjecting the surface of the heat-resistant resin sheet of polyimides, polyamides, poly (ethylene terephthalate), epoxy or the like, or the composites of these materials and glass fiber, carbon fiber, boron fiber, metal fiber or the like to conductivity treatment with a simple substance of metal or an alloy thereof and a transparent conductive oxide by the methods such as plating, evaporating, sputtering and coating.

The supporting member is preferably as thin as possible in terms of its cost, storage space, etc., as long as it is sufficiently strong to maintain its curved shape formed during its movement. To be concrete, the thickness of the supporting member is preferably 0.01 mm to 5 mm, more preferably 0.02 mm to 2 mm, and most preferably 0.05 mm to 1 mm. when using a thin film of metal, even if it is made relatively thin, a desired strength is easy to obtain.

The width of the supporting member is not restricted, and it depends on the size of the vacuum container, etc. The length of the supporting member is not restricted, either. The supporting member may be as long as it can be wound in roll, or it may be obtained by elongating a long supporting member by welding, etc.

In the present invention, although the supporting member is heated and cooled in a short period of time, since it is not preferable for the distribution of temperature to expand in the longitudinal direction, the heat conduction of the supporting member is desirably as low as possible in the direction of movement, and in order for the temperature of the supporting member to follow the heating treatment and cooling treatment, the heat conduction is preferably high in the direction of thickness.

In order to allow the heat conduction of the supporting member to become low in the direction of movement and become high in the direction of thickness, its thickness should be small. When the thickness of the supporting member is uniform, the value of heat conduction multiplied by thickness is preferably $1 \times 10^{-1}$ W/K or smaller, more preferably $5 \times 10^{-2}$ W/K or smaller.

Metal Layer

The materials used for the metal layers according to the present invention include, for example, metals such as Ag, Au, Pt, Ni, Cr, Cu. Al, Ti, Zn, Mo and W and the alloys thereof. The thin films of these metals are formed, for example, by the methods such as vacuum evaporation, electron beam evaporation, sputtering. The sheet resistance value of each metal layer is preferably 50 Ω or lower and more preferably 10 Ω or lower so that the metal thin film formed should not become a resistant component against the output power of the photovoltaic element.

Metal Oxide Layer

In the metal oxide layers according to the present invention, their transmittance of light is desirably 85% or higher so that light from the sun and a white fluorescent lamp is effectively absorbed into each semiconductor layer. From the electrical viewpoint, their sheet resistance is desirably 100 Ω or lower so that they should not become a resistant component against the output power of the photovoltaic element. The materials having these properties include, for example, metal oxides such as $SnO_2$, $In_2O_3$, ZnO, CdO, $Cd_2SnO_4$ and ITO ($In_2O_3+SnO_2$).

In some cases, the metal oxide layer is stacked on the p-type semiconductor layer or n-type semiconductor layer of the photovoltaic element, and in the other cases, when the photovoltaic element is formed on a light-transmitting type supporting member and it is irradiated with light from the side of the light-transmitting type supporting member, the metal oxide layer is stacked between the supporting member and the photovoltaic element. In either case, the materials for the metal oxide layer should be selected so that the metal oxide layer and the layers adjacent to both the upper and lower sides of the metal oxide layer can closely touch with each other.

The metal oxide layer is preferably deposited to the thickness which meets the requirements of increasing reflection. The methods of forming the metal oxide layers used include, for example, the resistance heating evaporation method, the electron beam evaporation method, the sputtering method and the spray method, and the proper one is selected according to the requirement. In addition, the metal oxide layers according to the present invention may be formed by the reactive sputtering method in which the metals constituting the aforementioned metal oxides are targeted.

Semiconductor Layer

For the semiconductor layers according to the present invention non-single-crystalline silicon semiconductors are suitably used. And in the formation of such semiconductors, CVD apparatuses utilizing high-frequency electric power and microwave electric power can be used. In the formation of a photovoltaic element having the construction shown in FIG. 1, a semiconductor layer 108 may be formed in an apparatus which is connected to an apparatus for forming a metal layer 101 and a metal oxide layer 102 in such a manner as to construct a single vacuum chamber, or it may be formed in another apparatus.

An amorphous silicon (a-Si) stacked nip semiconductor junction is formed using $H_2$ gas while a gas consisting mainly of the atoms belonging to the IV group of the periodic table is introduced as a material gas into a vacuum chamber and a gas containing the atoms belonging to the V group of the periodic table is introduced into each of the p-type and n-type layers. Suitably this semiconductor layer is of an amorphous type or microcrystalline type, however it is not limited to these specific crystalline forms. Further, the semiconductor junction can have a pin construction instead of a nip construction and a plurality of semiconductor junctions can be stacked.

As the compounds which contain silicon atoms and can be gasified used are, for example, linear or cyclic silane compounds. To be concrete, the compounds include, for example, $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_3$, $SiF_3D$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_6$, $Si_2Cl_{6,}$ $SiHCl_3$, $SiH_2Br_2$, $SiH_2Cl_2$ and $Si_2Cl_3F_3$ which are in the gas state or can be easily gasified.

The compounds containing germanium atoms include, for example, $GeH_4$, $GeD_4$, $GeF_4$, $GeFH_3$, $GeF_3H$, $GeH_2D_2$, $GeH_3D$, $GeH_6$ and $Ge_2D_6$.

The substances introduced into the p-type layer or n-type layer so as to control charged electrons include, for example, the atoms belonging to the III group and the V group of the periodic table.

The starting substances effectively used for introducing the III group atoms, to be concrete, the starting substances effectively used for introducing boron atoms include, for example, boron hydrides such as $B_2H_6$, $B_4H_{10}$, $B_5H_9$, $B_5H_{11}$, $B_6H_{10}$, $B_6H_{12}$ and $B_6GH_{14}$ and boron halides such as $BF_3$ and $BCl_3$. And $AlCl_3$, $GaCl_3$, $InCl_3$ and $TlCl_3$ are also included in the starting substances effectively used for introducing the III group atoms. Of all the above $B_2H_6$ and $BF_3$ are particularly suitable.

The starting substances effectively used for introducing the V group atoms, to be concrete, the starting substances effectively used for introducing phosphorus atoms include, for example, phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$ and $PI_3$. And $AlH_3$, $AsF_3$, $AsCl_3$, $AsBr_3$, $AsF_6$, $SbH_3$, $SbF_3$, $SbCl_3$, $SbCl_5$, $BiH_3$, $BiCl_3$ and $BiBr_3$ are also included in the starting substances effectively used for introducing the V group atoms. Of all the above $PH_3$ and $PF_3$ are particularly suitable.

The above compounds which can be gasified may be diluted appropriately with gas such as $H_2$, He, Ne, Ar, Xe, Kr, etc. and introduced into a deposition chamber.

Transparent Electrode

In the transparent electrode according to the present invention, its transmittance of light is desirably 85% or higher so that light from the sun and a white fluorescent lamp is effectively absorbed into each semiconductor layer. From the electrical viewpoint, its sheet resistance value is desirably 100 Ω or lower so that they should not become a resistant component against the output power of the photovoltaic element. The materials having these properties include, for example, metal oxides such as $SnO_2$, $In_2O_3$, ZnO, CdO, $Cd_2SnO_4$ and ITO ($In_2O_3+SnO_2$) and metal thin films formed by depositing Au, Al, Cu, etc. in the form of semi-transparent extremely thin film.

In some cases, the transparent electrode is stacked on the p-type semiconductor layer or n-type semiconductor layer of the photovoltaic element, and in the other cases, when the photovoltaic element is formed on a light-transmitting type supporting member and it is irradiated with light from the side of the light-transmitting type supporting member, the transparent electrode is stacked on the supporting member. In either case, the materials for the transparent electrode should be selected so that the transparent electrode, p- and n-type layers and the supporting member can closely touch with each other. The transparent electrode is preferably deposited to the thickness which meets the antireflection requirement. The methods of forming the transparent electrode include, for example, the resistance heating evaporation method, the electron beam evaporation method, the sputtering method and the spray method, and the proper one is selected according to the requirement.

Current Collecting Electrode

As the current collecting electrodes of the photovoltaic element according to the present invention suitably used are those formed of silver paste by the screen printing method or those formed of Cr, Ag, Au, Cu, Ni, Mo or Al by the vacuum evaporation method using a mask. The current collecting electrodes may be formed by attaching metal wires of Cu, Au, Ag and Al to which carbon or Ag powder is applied with resin on the surface of the photovoltaic element.

When forming a photovoltaic apparatus of a desired output voltage and output current using photovoltaic elements of the present invention, the photovoltaic elements of the present invention are connected in series or in parallel, a protecting layer is formed on each of the front and back sides thereof, and an output electrode is attached. When the photovoltaic elements of the present invention are connected in series, a reverse current protecting diode can be incorporated.

The examples of the methods of forming a photovoltaic element according to the present invention will be described below; however, it should be understood that the present invention is not intended to be limited to these specific examples.

EXAMPLE 1

In this example, a metal layer 101 and a metal oxide layer 102 shown in FIG. 1 were formed by using the formation apparatus of the multi-chamber separation type system shown FIG. 3

To the apparatus of FIG. 3 a raw material gas supplying system (not shown in the figure) was connected via a feed pipe. As raw material gases used were those purified to the ultrapurity. As raw material gas cylinders connected were a $H_2$ gas cylinder, an Ar gas cylinder and a He gas cylinder. As targets for forming the metal layer 101 and the metal oxide layer 102, Ag and ZnO were used, respectively, and the targets were arranged in such a manner that each of them could be subjected to sputtering under vacuum. As a supporting member used was a stainless steel plate of 0–5 mm thickness, 50×50 $mm^2$ which had been subjected to ultrasonic cleaning with acetone and isopropanol and warm-air drying. Ag metal layer 101 was formed by the DC magnetron sputtering method using a DC power source 325 as a sputtering power source.

The method of forming the Ag metal layer will be described step by step below.

(1) A supporting member 390 (denoted by reference numeral 100 in FIG. 1) having been subjected to cleaning was arranged on a supporting member transporting rail 313 in a load chamber 301, and the load chamber 301 was evacuated with a vacuum pump not shown in the figure to a pressure of about $1 \times 10^{-5}$ Torr.

(2) The supporting member was transported into a transportation chamber 302 and a deposition chamber 320, each of which was evacuated previously with a vacuum pump not shown in the figure, by opening a gate valve 306. The supporting member 390 was heated at a temperature increasing speed of 15° C./sec, while the backside of the supporting member 390 and a heater 310 for heating the supporting member closely touching with each other, the temperature of the supporting member was set to 290° C., and then the deposition chamber 320 was evacuated to a pressure of about $3 \times 10^{-6}$ Torr with a vacuum pump not shown in the figure.

(3) At 50 sccm, Ar gas was introduced into the deposition chamber 320 through a gas feed pipe 324, the pressure was controlled to become 6 mTorr with a conductance valve not shown in the figure, an electric current is passed through a toroidal coil 323, and 380 V of DC power was applied from a sputtering power source 325, so as to generate Ar plasma.

(4) The target shutter 326 was opened so as to form a Ag metal layer 101 on the surface of a stainless steel plate, and the same shutter was closed once the Ag metal layer 101 became 0.8 $\mu$m thick, so as to extinguish the Ar plasma.

(5) A heater 310 for heating the supporting member was moved upward away from the supporting member 390, and the supporting member was cooled in the atmosphere of a supporting member cooling gas consisting of He gas at a temperature decreasing speed of 5° C./sec to 100° C. or lower Then the supporting member 390 was transported into a transportation chamber 303 and a deposition chamber 330, which was evacuated previously with a vacuum pump not shown in the figure, by opening a gate valve 307. The supporting member 390 was heated at a temperature increasing speed of 20° C./sec, while the backside of the supporting member 390 and a heater 311 for heating the supporting member closely touching with each other, the temperature of the supporting member was set to 290° C. and a deposition chamber 330 was evacuated with a vacuum pump not shown in the figure to a pressure of $2 \times^{-3}$ Torr.

(6) After the temperature of the supporting member reached 290° C. a heater 311 for heating a supporting member was moved upward away from the supporting member 390, and the supporting member was cooled in the atmosphere of a supporting member cooling gas consisting of He gas at a temperature decreasing speed of 5° C./sec to 100° C. or lower. Then the supporting member 390 was transported into a transportation chamber 304 and a deposition chamber 340, which was evacuated previously with a vacuum pump not shown in the figure, by opening a gate valve 308. The supporting member 390 was heated at a temperature increasing speed of 20° C./sec, while the backside of the supporting member 390 and a heater 312 for heating a supporting member closely touching with each other, the temperature of the supporting member was set to 290° C. and then a deposition chamber 340 was evacuated with a vacuum pump not shown in the figure to a pressure of $2 \times 10^6$ Torr.

(7) At 60 sccm, Ar gas was introduced into the deposition chamber 340 through a gas feed pipe 344, the pressure was controlled to become 6 mTorr with a conductance valve not shown in the figure, an electric current was passed through a toroidal coil 343, and 380 V of DC power was applied from a sputtering power source 345, so as to generate Ar plasma. Then the target shutter 346 was opened so as to form a ZnO metal oxide layer 102 on the surface of the Ag metal layer 101, and the same shutter was closed once the ZnO metal oxide layer 102 became 1.5 $\mu$m thick, so as to extinguish the plasma.

(8) A heater 312 for heating a supporting member was moved up, and after the temperature of the supporting member was decreased in the atmosphere of He gas, as a supporting member cooling gas, at a temperature decreasing speed of 5° C./sec to 100° C. or lower, the supporting member 390 was transported into an unload chamber 305, which was evacuated previously with a vacuum pump not shown in the figure, by opening a gate valve 309.

A substrate 190 consisting of a supporting member and the metal layer and the metal oxide layer formed on the supporting member according to the present invention was made by the above steps. Hereinafter the light reflection layer which is layers formed on the supporting member will be referred to as "SE1".

REFERENCE EXAMPLE 1-1

In this example, a light reflection layer (SR1-1) was formed on a supporting member in the same manner as in Example 1, except that in the heat treatment step after forming an Ag metal layer 101, the supporting member was subjected to cooling treatment in the same manner as In example 1, but not subjected to heating treatment.

REFERENCE EXAMPLE 1-2

In this example, a light reflection layer (SR1-2) was formed on a supporting member in the same manner as in example 1, except that in the heat treatment step after forming an Ag metal layer 101, the supporting member was subjected to cooling treatment in the same manner as in example 1 and subjected to heating treatment at 80° C.

REFERENCE EXAMPLE 1-3

In this example, a light reflection layer (SR1-3) was formed on a supporting member in the same manner as in example 1, except that in the heat treatment step after forming an Ag metal layer 101, the supporting member was subjected to cooling treatment in the same manner as in example 1 and subjected to heating treatment at 450° C.

Five light reflection layers were formed for each of the four types layers, SE1, SR1-1, SR1-2 and SR1-3. Table 1 shows the evaluation results of the total reflectance and irregular reflectance of each light reflection layer obtained by measuring the light reflectance thereof. The total reflectance and irregular reflectance shown in Table 1 are measurements at a wavelength of 800 nm of all the measurements obtained using a spectrophotometer (manufactured by JASCO Corporation: Ultraviolet Visible Near Infrared Ray Spectrophotometer V-570). And each measurement in Table 1 is expressed normalized with the measurement of SE1 as 1.

TABLE 1

| Specimen | Total Reflectance | Irregular Reflectance |
|---|---|---|
| (SE1) | 1.00 | 1.00 |
| (SR1-1) | 0.89 | 0.70 |
| (SR1-2) | 0.82 | 0.82 |
| (SR1-3) | 0.95 | 0.72 |

The results in Table 1 show that the light reflection layer SE1 of example 1 is superior to any other light reflection layers (SR1-l, SR1-2 and SR1-3) of Reference Examples in every evaluation results. And it has been found that the decrease in total reflectance and irregular reflectance is controlled by the method of cooling a supporting member having an Ag layer as a metal layer formed thereon with He gas, heating it at a heating temperature for 2 minutes, again cooling it with He gas, and depositing ZnO as a metal oxide to form a metal oxide layer.

EXAMPLE 2

In this example, a photovoltaic element shown in FIG. 1 was made by using a substrate 190, which consists of a supporting member 100 and a metal layer 101 and a metal oxide layer 102 formed on the supporting member 100 in the same manner as in Example 1, and forming a semiconductor layer 180 on the substrate 190 by using the formation apparatus of the multi-chamber separation type system shown in FIG. 4.

The apparatus 400 shown in FIG. 4 can perform both the MWPCVD method and the RFPCVD method. By using this apparatus, the semiconductor layers 180 having a predetermined layer structure were formed on the metal oxide layer 102. Table 2 shows the conditions under which the semiconductor layers were formed.

TABLE 2

| Layers | Gas Flow Rate [sccm] | | | | | Pressure [Torr] | Electric Power [W/cm²] MW/RF | Substrate Temperature [° C.] | Layer Thickness [nm] |
|---|---|---|---|---|---|---|---|---|---|
| | SiH₄ | GeH₄ | H₂ | 2% PH₃/H₂ | 2% BF₃/H₂ | | | | |
| RF n-type layer | 2 | | 100 | 10 | | 1.3 | /0.05 | 350 | 20 |
| RF i-type layer | 8 | | 100 | | | 0.8 | /0.008 | 300 | 10 |
| MW l-type layer | 40 | 41 | 100 | | | 0.011 | 0.13/0.33 | 370 | 110 |
| RF i-type layer | 8 | | 100 | | | 0.75 | /0.008 | 300 | 23 |
| RF p-type layer | 1.1 | | 40 | | 80 | 1.8 | /0.07 | 300 | 10 |

Then ITO of 70 nm thickness, as a transparent electro-conductive layer 112, was formed on the RF p-type layer 105 by the vacuum evaporation method.

Further, after placing a comb-shaped mask with holes on the transparent electro-conductive layer 112, an comb-shaped current collecting electrode 113 consisting of Cr (40 nm thick)/Ag (1000 nm thick)/Cr (40 nm thick) was formed by the vacuum evaporation method.

A photovoltaic element according to the present invention was thus made. Hereinafter this photovoltaic element will be referred to as "SCE2".

REFERENCE EXAMPLE 2-1

A photovoltaic element (SCR2-1) was formed in the same manner as in Example 2, except that a ZnO metal oxide layer 102 was formed after forming an Ag metal layer 101 without subjecting its supporting member to heat treatment.

Six photovoltaic elements were made for each of the two types photovoltaic elements (SCE2 and SCR2-1) as described above.

Table 3 shows the normalized initial photoelectric conversion factor of each photovoltaic element, the normalized results of light degradation tests (short-circuit current, open voltage) on each photovoltaic element, and the yield of each photovoltaic element. The light degradation tests were carried out by subjecting each photovoltaic element to AM-1.5 (100 mW/cm$^2$) light irradiation for 500 hours. The characteristics of photoelectric conversion factor were evaluated by subjecting each photovoltaic element to AM-1.5 (100 mW/cm$^2$) light irradiation and measure the V-I characteristics. And the yield of each photovoltaic element was evaluated.

TABLE 3

| Specimen | Initial Photoelectric Conversion Factor | Short-circuit Current | Open Voltage | Yield |
| --- | --- | --- | --- | --- |
| (SCE2) | 1.00 | 1.00 | 1.00 | 1.00 |
| (SCR2-1) | 0.85 | 0.87 | 0.90 | 0.92 |

Table 3 shows that the photovoltaic element (SCE2) of Example 2 having a metal layer according to the present invention is superior to the photovoltaic element (SCR2-1) in every evaluation results.

EXAMPLE 3

In this example, a triple type photovoltaic element shown in FIG. 2 was formed by using the formation apparatus of the Roll to Roll type system shown in FIGS. 5 and 6.

The supporting member used was a stainless steel sheet 300 m in length, 30 cm in width and 0.2 mm in thickness. FIG. 6 is a schematic sectional view of the formation apparatus of the Roll to Roll type system for continuously forming a metal layer and a metal oxide layer according to the present invention. FIG. 5 is a schematic sectional view of the formation apparatus of the Roll to Roll type system for continuously forming photovoltaic elements.

Now the method of forming a metal layer and a metal oxide layer will be described.

The apparatus for continuously forming a metal layer and a metal oxide layer shown in FIG. 6 includes a supporting member delivery chamber 610, a plurality of deposition chambers 611 to 613, a supporting member winding chamber 614, all of which are arranged in sequence, and separation passages 616, 617, 618 and 619 each of which is provided between the above two adjacent chambers so as to connect all the above chambers. Each deposition chamber has an outlet through which the chamber can be evaporated.

A strip supporting member 621 from the supporting member delivery chamber 610 is transported through these deposition chambers and separation passages and wound up in the supporting member winding chamber 614. During this transportation, gas is introduced from each gas inlet of each deposition chamber and separation passage and the gas is discharged from each outlet. With such a construction, each layer can be formed.

In the deposition chamber 611, a metal layer consisting of Ag was formed, in the heat treatment chamber 612 the metal layer according to the present invention was subjected to heat treatment, and the deposition chamber 613 the metal oxide layer consisting of ZnO was formed. In each deposition chamber, halogen lamp heaters 641, 642 and 643 for heating the supporting member from its backside are arranged, so that the temperature increase or heating of the supporting member can be conducted. And the separation passages 617 and 618 have a function of decreasing temperature according to the present invention. In the deposition chamber 611, the DC magnetron sputtering method is performed, and Ar gas is introduced through a gas inlet 632 and Ag is used as a target 650. In deposition chamber 613, the DC magnetron sputtering method or the RF magnetron sputtering method is performed, and Ar gas is introduced through a gas inlet 636 and ZnO is used as a target 670. In the heat treatment chamber 612, the time of subjecting the supporting member to heat treatment can be altered freely by the combination of its transportation speed and the arrangement of the halogen lamp heaters. In this example, the transportation speed and the arrangement of the halogen lamp heaters were determined so that the supporting member could be subjected to heat treatment for 3 minutes from the instance of its reaching a heat treatment temperature of 350° C.

The formation of the metal layer and the metal oxide layer on the supporting member according to the present Invention was carried out under the predetermined conditions shown in Table 4. The supporting member having the metal layer and metal oxide layer formed thereon was wound into the supporting member winding chamber 614.

TABLE 4

| | Formation of Metal Layer: Ag | Heat Treatment Step | Formation of Metal Oxide Layer: ZnO |
| --- | --- | --- | --- |
| Temperature Increasing Speed [° C./S] | 15 | 20 | 15 |
| Temperature of Supporting Member [° C.] | 280 | 350 | 300 |
| Ar Gas Flow Rate [sccm] | 30 | 10 | 30 |
| Pressure [mTorr] | 3 | 2 | 4 |
| Type of Target | Ag | — | ZnO |
| Type of Sputtering Electric Power | DC | — | DC |
| Sputtering Voltage [V] | 380 | — | 385 |
| Layer Thickness [$\mu$m] | 0.65 | — | 1.0 |
| Type of Supporting Member Cooling Gas | $H_2$ | $H_2$ | He |
| Temperature Decreasing Speed [° C./S] | 10 | 10 | 15 |

The supporting member having the metal layer and metal oxide layer formed thereon by the above steps was used as a substrate. Then a photovoltaic element was formed on the substrate.

Now the method of forming a photovoltaic element will be described below. A triple type photovoltaic element having layer construction shown in FIG. 2 was formed by using the formation apparatus of the Roll to Roll type system for forming a photovoltaic element shown in FIG. 5 under the conditions of forming a triple type photovoltaic element shown in Table 5.

TABLE 5

| Layers | Gas Flow Rate [sccm] | | | | | Pressure [Torr] | Electric Power [W/cm²] MW/RF | Substrate Temperature [° C.] | Layer Thickness [nm] |
| --- | --- | --- | --- | --- | --- | --- | --- | --- | --- |
| | SiH₄ | GeH₄ | H₂ | 2% PH₂/H₂ | 2% BF₂/H₂ | | | | |
| RF n-type layer | 100 | | 700 | 50 | | 1.0 | /100 | 340 | 30 |
| RF i-type layer | 10 | | 200 | | | 1.05 | /25 | 280 | 10 |
| MW I-type layer | 50 | 50 | 300 | | | 0.005 | 400/ | 350 | 100 |
| RF i-type layer | 10 | | 200 | | | 1.05 | /25 | 300 | 10 |
| RF p-type layer | 3 | | 1000 | | 100 | 1.0 | /200 | 250 | 10 |
| RF n-type layer | 50 | | 350 | 100 | | 1.0 | /30 | 270 | 10 |
| RF I-type layer | 10 | | 200 | | | 1.05 | /25 | 280 | 10 |
| MW i-type layer | 60 | 40 | 300 | | | 0.004 | 400/ | 350 | 100 |
| RF i-type layer | 8 | | 160 | | | 1.05 | /25 | 300 | 10 |
| RF p-type layer | 3 | | 1000 | | 100 | 1.0 | /200 | 250 | 10 |
| RF n-type layer | 40 | | 1000 | 100 | | 1.0 | /75 | 270 | 10 |
| RF i-type layer | 90 | | 300 | | | 1.05 | /200 | 220 | 90 |
| RF p-type layer | 2 | | 500 | | 8 | 1.0 | /500 | 170 | 10 |

First, a sheet substrate, on which the metal layer and the metal oxide layer according to the present invention were formed, was set in a load chamber 5010 for introducing a sheet substrate The sheet substrate was passed through all the deposition chambers and gas gates and connected to the sheet winding jig of an unload chamber 5150. Each deposition chamber was subjected to exhaust with an exhaust apparatus not shown in the figure to $1 \times^{-3}$ Torr or lower. A desired raw material gas was supplied from each of the mixing apparatuses for film deposition 5024, 5034, 5044, 5054, 5064, 5074, 5084, 5094, 5104, 5114, 5124, 5134 and 5144 to each deposition chamber. And the gas was supplied from each gate gas supplying apparatus to each of the gas gates 5201, 5202, 5203, 5204, 5205, 5206, 5207, 5208, 5209, 5210, 5211, 5212, 5213 and 5214. The substrate was heated with a heater for heating a substrate of each deposition chamber, and the vacuum level of each deposition chamber was controlled by adjusting the opening and closing of the exhaust valve of each exhaust apparatus. After the substrate temperature and the vacuum level became stable, the transportation of the sheet substrate was started, and RF electric power and MW (frequency; 2.45 GHz) electric power for generating plasma were supplied to each chamber. Thus a triple type photovoltaic element having three pin structures stacked, as shown in FIG. 2, was formed on the sheet substrate 290.

Then, ITO of 70 nm thickness was deposited on the RF p-type layer 211, which was a layer formed last, as a transparent electrically conductive layer 212 by the vacuum evaporation method.

Further, a mask with a comb-shaped hole was placed on the transparent electrically conductive layer 212, and an comb-shaped current collecting electrode 213 consisting of Cr (40 nm thick)/Ag (1000 nm thick)/Cr (40 nm thick) was deposited by the vacuum evaporation method.

Thus a photovoltaic element according to the present invention was formed. Hereinafter this photovoltaic element will be referred to as "SCE3".

REFERENCE EXAMPLE 3-1

A photovoltaic element (SCR3-1) was formed in the same manner as in Example 3, except that a ZnO metal oxide layer 202 was formed after forming an Ag metal layer 201 without subjecting its supporting member to heat treatment.

Six photovoltaic elements of 5 by 5 cm square were cut off from each of the above two types photovoltaic elements (SCE3) and (SCR3-1) on the strip member at intervals of 10 m.

Table 6 shows the normalized initial photoelectric conversion factor of each photovoltaic element, the normalized results of light degradation tests (short-circuit current, open voltage) on each photovoltaic element, and the yield of each photovoltaic element. The light degradation tests were carried out by subjecting each photovoltaic element to AM-1.5 (100 mW/cm²) light irradiation for 500 hours. The characteristics of photoelectric conversion factor were evaluated by subjecting each photovoltaic element to AM-1.5 (100 mW/cm²) light irradiation and measuring the V-I characteristics. And the yield of each photovoltaic element was evaluated.

TABLE 6

| Specimen | Initial Photoelectric Conversion Factor | Short-circuit Current | Open Voltage | Yield |
| --- | --- | --- | --- | --- |
| (SCE3) | 1.00 | 1.00 | 1.00 | 1.00 |
| (SCR3-1) | 0.84 | 0.85 | 0.84 | 0.82 |

Table 6 shows that the photovoltaic element (SCE3) of Example 3 having a metal layer according to the present invention is superior to the photovoltaic element (SCR3-1) in every evaluation results. And it has been found that the yield was considerably improved by carrying out heat treatment, for the heat treatment could prevent short-circuit current from defective portions.

EXAMPLE 4

Figure 7:
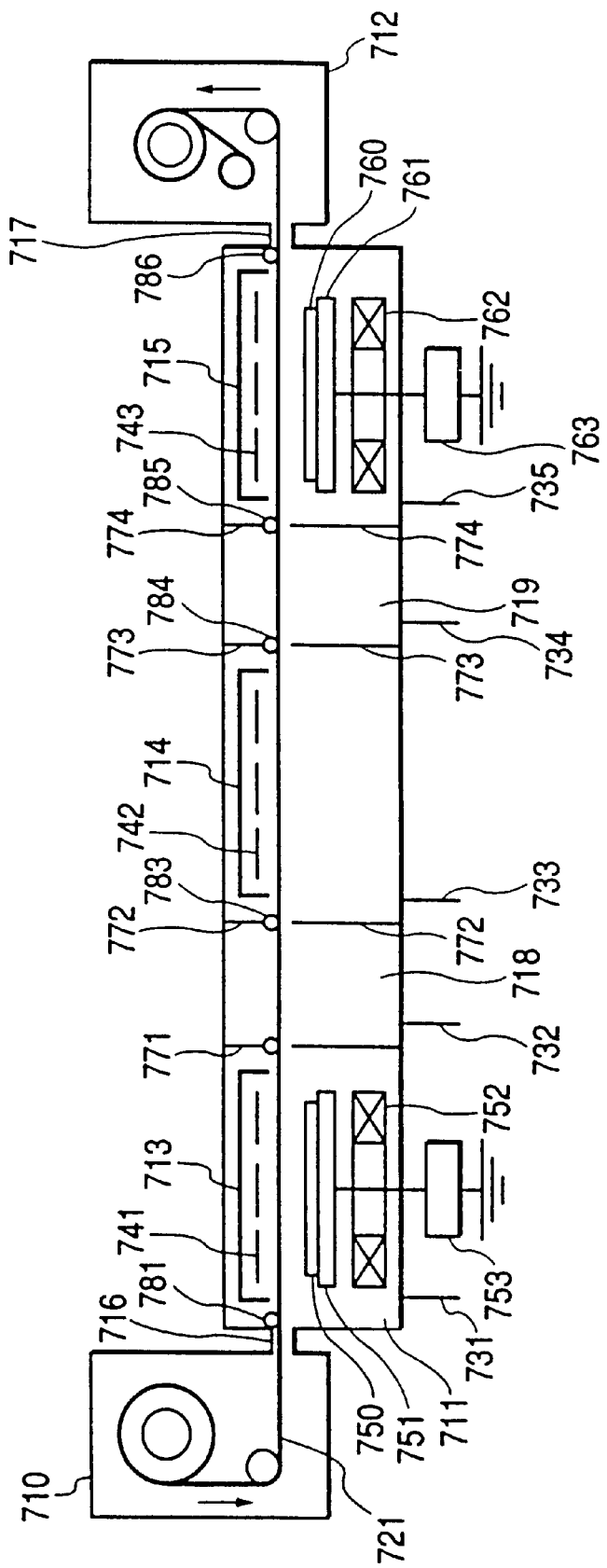
FIG. 7 is a schematic sectional view of another example of the system, the Roll to Roll type system, for forming a metal layer and a metal oxide layer which constitute a substrate for a photovoltaic element according to the present invention.

In this example, a triple type photovoltaic element shown in FIG. 2 was formed by using the formation apparatus of the Roll to Roll type system shown in FIGS. 5 and 7.

The supporting member used was a stainless steel sheet 300 m in length, 30 cm in width and 0.2 mm in thickness. FIG. 7 is a schematic sectional view of another apparatus of the Roll to Roll type system for continuously forming a metal layer and a metal oxide layer according to the present invention. FIG. 5 is a schematic sectional view of the apparatus of the Roll to Roll type system for continuously forming photovoltaic elements.

Now the method of forming a metal layer and a metal oxide layer will be described.

The apparatus for continuously forming a metal layer and a metal oxide layer shown in FIG. 7 includes a supporting member delivery chamber 710, a deposition and heat treatment chamber 711, a supporting member winding chamber 712, all of which are arranged in sequence, and separation passages 716 and 717 each of which is provided between the above two adjacent chambers so as to connect all the above chambers. Each deposition chamber has an outlet through which the chamber can be evacuated therein.

The above deposition and heat treatment chamber consists of a deposition section 713, a heat treatment section 714 and a deposition section 715 which are separated from each other by partition plates 771 to 774 and magnet rollers 781 to 786 for keeping a substrate in a straight line so that gas does not flow in.

formed. In each deposition section and heat treatment section, lamp heaters 741, 742 and 743 for heating the supporting member from its backside are arranged, so that the supporting member 721 is heated to a predetermined temperature in each deposition section. And the separation passages 718 and 719 have a function of decreasing temperature according to the present invention. In the deposition section 713, the DC magnetron sputtering method is performed, and Ar gas is introduced through a gas inlet 731 and Ag is used as a target 750. In deposition chamber 715, the DC magnetron sputtering method or the RF magnetron sputtering method is performed, and Ar gas is introduced through a gas inlet 735 and ZnO is used as a target 760.

The formation of the metal layer and the metal oxide layer according to the present invention was carried out under the predetermined conditions shown in Table 7. The supporting member having the metal layer and metal oxide layer formed thereon was wound into the supporting member winding chamber 712.

TABLE 7

|  | Formation of Metal Layer: Ag | Heat Treatment Step | Formation of Metal Oxide Layer: ZnO |
| --- | --- | --- | --- |
| Temperature Increasing Speed [° C./S] | 15 | 25 | 15 |
| Temperature of Supporting Member [° C.] | 280 | 400 | 400 |
| Ar Gas Flow Rate [sccm] | 30 | 15 | 30 |
| Pressure [mTorr] | 3 | 2 | 4 |
| Type of Target | Ag | — | ZnO |
| Type of Sputtering Electric Power | DC | — | DC |
| Sputtering Voltage [V] | 380 | — | 385 |
| Layer Thickness [μm] | 0.65 | — | 1.0 |
| Type of Supporting Member Cooling Gas | $H_2$ | $H_2$ | He |
| Temperature Decreasing Speed [° C./S] | 10 | 10 | 15 |

A strip supporting member 721 from the support delivery chamber is transported through these deposition chambers, heat treatment chambers and separation passages and wound up in the supporting member winding chamber. At the same time, a gas is introduced from each gas inlet and the gas is discharged from each outlet so that each layer can be formed.

In the deposition section 713 a metal layer consisting of Ag is formed, in the heat treatment section 714 the metal layer is subjected to heat treatment, and the deposition section 715 the metal oxide layer consisting of ZnO is The supporting member having the metal layer and metal oxide layer formed thereon by the above steps was used as a substrate. Then a photovoltaic element was formed on the substrate.

Now the method of forming a photovoltaic element will be described below. A triple type photovoltaic element having layer construction shown in FIG 2 was formed by using the apparatus of the Roll to Roll type system for forming a photovoltaic element shown in FIG. under the conditions of forming a triple type photovoltaic element shown in Table 8.

TABLE 8

| Layers | Gas Flow Rate [sccm] | | | | | Pressure [Torr] | Electric Power [W/cm²] MW/RF | Substrate Temperature [° C.] | Layer Thickness [nm] |
| --- | --- | --- | --- | --- | --- | --- | --- | --- | --- |
| | $SiH_4$ | $GeH_4$ | $H_2$ | 2% $PH_2/H_2$ | 2% $BF_2/H_2$ | | | | |
| RF n-type layer | 90 | | 900 | 65 | | 1.0 | /90 | 340 | 25 |
| RF i-type layer | 10 | | 200 | | | 1.05 | /25 | 300 | 10 |
| MW i-type layer | 50 | 55 | 300 | | | 0.005 | 400/100 | 365 | 110 |
| RF l-type layer | 10 | | 200 | | | 1.05 | /25 | 300 | 22 |

TABLE 8-continued

| Layers | Gas Flow Rate [sccm] | | | | | Pressure [Torr] | Electric Power [W/cm²] MW/RF | Substrate Temperature [° C.] | Layer Thickness [nm] |
|---|---|---|---|---|---|---|---|---|---|
| | SiH$_4$ | GeH$_4$ | H$_2$ | 2% PH$_2$/H$_2$ | 2% BF$_2$/H$_2$ | | | | |
| RF p-type layer | 3 | | 1000 | | 100 | 1.0 | /200 | 250 | 10 |
| RF n-type layer | 50 | | 350 | 100 | | 1.0 | /30 | 270 | 10 |
| RF i-type layer | 10 | | 200 | | | 1.05 | /25 | 280 | 10 |
| MW i-type layer | 65 | 45 | 300 | | | 0.003 | 400/100 | 350 | 90 |
| RF I-type layer | 8 | | 160 | | | 1.05 | /25 | 300 | 10 |
| RF p-type layer | 3 | | 1000 | | 100 | 1.0 | /200 | 250 | 10 |
| RF n-type layer | 10 | | 1000 | 100 | | 1.0 | /75 | 270 | 10 |
| RF i-type layer | 90 | | 300 | | | 1.05 | /200 | 220 | 90 |
| RF p-type layer | 2 | | 500 | | 90 | 1.0 | /500 | 170 | 10 |

Then, ITO of 70 nm thickness was deposited on the RF p-type layer 211, which was a layer formed last, as a transparent electrically conductive layer 212 by the vacuum evaporation method.

Further, a mask with a comb-shaped hole was placed on the transparent electrically conductive layer 212, and a comb-shaped current collecting electrode 213 consisting of Cr (40 nm thick)/Ag (1000 nm thick)/Cr (40 nm thick) was deposited by the vacuum evaporation method.

Thus a photovoltaic element according to the present invention was formed. Hereinafter this photovoltaic element will be referred to as "SCE4".

REFERENCE EXAMPLE 4-1

A photovoltaic element (SCR4-1) was formed in the same manner as in Example 4, except that a ZnO metal oxide layer 202 was formed after forming an Ag metal layer 201 without subjecting its supporting member to heat treatment.

Six photovoltaic elements of 5 cm by 5 cm square were cut off from each of the above two types photovoltaic elements (SCE4) and (SCR4-1) on the strip supporting member at intervals of 10 m.

Table 9 shows the normalized initial photoelectric conversion factor of each photovoltaic element, the normalized results of light degradation tests (short-circuit current, open voltage) on each photovoltaic element, and the yield of each photovoltaic element. The light degradation tests were carried out by subjecting each photovoltaic element to AM-1.5 (100 mW/cm²) light irradiation for 500 hours. The characteristics of photoelectric conversion factor were evaluated by subjecting each photovoltaic element to AM-1.5 (100 mW/cm²) light irradiation and measuring the V-I characteristics. And the yield of each photovoltaic element was evaluated.

TABLE 9

| Specimen | Initial Photoelectric Conversion Factor | Short-circuit Current | Open Voltage | Yield |
|---|---|---|---|---|
| (SCE4) | 1.00 | 1.00 | 1.00 | 1.00 |
| (SCR4-1) | 0.81 | 0.81 | 0.80 | 0.76 |

Table 9 shows that the photovoltaic element (SCE4) of Example 4 having a metal layer according to the present invention is superior to the photovoltaic element (SCR4-1) in every evaluation results.

EXAMPLE 5

In this example, a metal layer and a metal oxide layers were formed on a supporting member at various As temperature increasing speeds ranging from 2° C./sec to 150° C./sec and photovoltaic elements were formed thereon so that the influence on initial photoelectric conversion factor was examined.

Table 10 shows the conditions under which the metal layer and the metal oxide layer are formed, and Table 11 shows the conditions under which triple type photovoltaic elements are formed. In this example, like Example 3, a triple type photovoltaic element shown in FIG. 2 was formed by using the apparatus for continuously forming a metal layer and a metal oxide layer shown in FIG. 6 and the apparatus for continuously forming photovoltaic elements shown in FIG. 5. The other points were just the same as in Example 3.

TABLE 10

| | Formation of Metal Layer: Ag | Heat Treatment Step | Formation of Metal Oxide Layer ZnO |
|---|---|---|---|
| Temperature Increasing Speed [° C./S] | 20 | 25 | 30 |
| Temperature of Supporting Member [° C.] | 350 | 350 | 350 |
| Ar Gas Flow Rate [sccm] | 30 | 15 | 30 |
| Pressure [mTorr] | 3 | 2 | 4 |
| Type of Target | Ag | — | ZnO |

TABLE 10-continued

|  | Formation of Metal Layer: Ag | Heat Treatment Step | Formation of Metal Oxide Layer ZnO |
|---|---|---|---|
| Type of Sputtering Electric Power | DC | — | DC |
| Sputtering Voltage [V] | 380 | — | 390 |
| Layer Thickness [μm] | 0.70 | — | 1.1 |
| Type of Supporting Member Cooling Gas | He | He | He |
| Temperature Decreasing Speed [° C./S] | 15 | 20 | 10 |

TABLE 11

| Layers | Gas Flow Rate [sccm] | | | | | Pressure [Torr] | Electric Power [W/cm²] MW/RF | Substrate Temperature [° C.] | Layer Thickness [nm] |
| | SiH$_4$ | GeH$_4$ | H$_2$ | 2% PH$_2$/H$_2$ | 2% BF$_2$/H$_2$ | | | | |
|---|---|---|---|---|---|---|---|---|---|
| RF n-type layer | 90 | | 900 | 65 | | 1.0 | /90 | 340 | 25 |
| RF I-type layer | 10 | | 200 | | | 1.05 | /25 | 300 | 10 |
| MW i-type layer | 45 | 55 | 300 | | | 0.010 | 380/100 | 365 | 110 |
| RF i-type layer | 10 | | 200 | | | 1.05 | /25 | 300 | 22 |
| RF p-type layer | 3 | | 1000 | | 100 | 1.0 | /200 | 250 | 10 |
| RF n-type layer | 50 | | 350 | 100 | | 1.0 | /30 | 270 | 10 |
| RF I-type layer | 10 | | 200 | | | 1.05 | /25 | 280 | 10 |
| MW i-type layer | 55 | 45 | 300 | | | 0.023 | 390/100 | 350 | 100 |
| RF i-type layer | 8 | | 160 | | | 1.05 | /25 | 300 | 10 |
| RF p-type layer | 3 | | 1000 | | 100 | 1.0 | /200 | 250 | 10 |
| RF n-type layer | 10 | | 1000 | 100 | | 1.0 | /75 | 270 | 10 |
| RF i-type layer | 90 | | 300 | | | 1.05 | /200 | 220 | 90 |
| RF p-type layer | 2 | | 500 | | 90 | 1.0 | /500 | 170 | 10 |

Table 12 shows the initial photoelectric conversion factor of each photovoltaic element and the results of light degradation tests (short-circuit current, open voltage) on each photovoltaic element. The conditions of conducting light degradation tests and measuring characteristics of photoelectric conversion factor were the same as in Example 3 In Table 12, the marks "○", "Δ" and "x" in the line of "Initial Photoelectric Conversion Factor" denote the initial photoelectric conversion factor variation of lower than 5%, of 5% or higher but lower than 10%, and of 10% or higher in comparison with the maximum value of the initial photoelectric conversion factor of all specimens, respectively. And the marks "○", "Δ" and "x" in the lines of "Short-circuit Current" and "Open Voltage" after light degradation tests denote the short-circuit current and open voltage variations of lower than 5% of 5% or higher but lower than 10% and of 10% or higher in comparison with the short-circuit current and open voltage before light degradation tests, respectively.

TABLE 12

| Temperature Increasing Speed [° C./sec] | 2 | 8 | 10 | 40 | 70 | 100 | 120 | 150 |
|---|---|---|---|---|---|---|---|---|
| Initial Photoelectric Conversion Factor | x | Δ | ○ | ○ | ○ | ○ | Δ | x |
| Short-circuit Current | x | Δ | ○ | ○ | ○ | ○ | x | x |
| Open Voltage | x | Δ | ○ | ○ | ○ | ○ | Δ | x |

From the evaluation results of photoelectric conversion factor, short-circuit current and open voltage shown in Table 12, it is found that the temperature increasing speed when forming the metal layer and the metal oxide layer is suitably in the range of 10° C./sec to 100° C./sec.

EXAMPLE 6

In this example, a metal layer and a metal oxide layer were formed on a supporting member at various temperature decreasing speeds ranging from 0.2° C./sec to 90° C./sec and photovoltaic elements were formed thereon, so that the influence on initial photoelectric conversion factor was examined.

Table 10 shows the conditions under which a metal layer and a metal oxide layer are formed, and Table 11 shows the conditions under which triple type photovoltaic elements are formed. In this example, like Example 3, a triple type photovoltaic element shown in FIG. 2 was formed by using the apparatus for continuously forming a metal layer and a metal oxide layer shown in FIG. 6 and the apparatus for continuously forming photovoltaic elements shown in FIG. 5. The other points were just the same as in Example 3.

Table 13 shows the initial photoelectric conversion factor of each photovoltaic element and the results of light degradation tests (short-circuit current, open voltage) on each photovoltaic element. The conditions of conducting light degradation tests and measuring characteristics of photoelectric conversion factor were the same as in Example 3. In Table 13, the marks "○", "Δ" and "x" in the line of "Initial Photoelectric Conversion Factor" denote the initial photoelectric conversion factor variation of lower than 5%, of 5% or higher but lower than 10%, and of 10% or higher in comparison with the maximum value of the initial photoelectric conversion factor of all specimens, respectively. And the marks "○", "Δ" and "x" in the lines of "Short-circuit Current" and "Open Voltage" after light degradation tests denote the short-circuit current and open voltage variations of lower than 5%, of 5% or higher but lower than 10%, and of 10% or higher in comparison with the short-circuit current and open voltage before light degradation tests, respectively.

TABLE 13

| Temperature Decreasing Speed [° C./sec] | 0.2 | 0.8 | 1 | 10 | 30 | 50 | 70 | 90 |
|---|---|---|---|---|---|---|---|---|
| Initial Photoelectric Conversion Factor | x | ○ | ○ | ○ | ○ | ○ | Δ | x |
| Short-circuit Current | x | Δ | ○ | ○ | ○ | ○ | Δ | x |
| Open Voltage | x | Δ | ○ | ○ | ○ | ○ | Δ | x |

From the evaluation results of photoelectric conversion factor, short-circuit current and open voltage shown in Table 13, it is found that the temperature decreasing speed when forming the metal layer and the metal oxide layer is suitably in the range of 1° C./sec to 50° C./sec.

EXAMPLE 7

In this example, a metal layer was formed on a supporting member, the supporting member was subjected to heat treatment at various temperatures ranging from 20° C. to 500° C., and a metal oxide layer was formed. Then photovoltaic elements were formed thereon and the influence on initial photoelectric conversion factor was examined.

In this example, like Example 3, a triple type photovoltaic element shown in FIG. 2 was formed by using the apparatus for continuously forming a metal layer and a metal oxide layer shown in FIG. 6 and the apparatus for continuously forming photovoltaic elements shown in FIG. 5. The conditions under which photovoltaic element was formed were the same as in Example 3, except that the heating temperature was varied.

Table 14 shows the initial photoelectric conversion factor of each photovoltaic element and the results of light degradation tests (short-circuit current, open voltage) on each photovoltaic element. The conditions of conducting light degradation tests and measuring characteristics of photoelectric conversion factor were the same as in Example 3. In Table 14, the marks "○", "Δ" and "x" in the line of "Initial Photoelectric Conversion Factor" denote the initial photoelectric conversion factor variation of lower than 5%, of 5% or higher but lower than 10%, and of 10% or higher in comparison with the maximum value of the initial photoelectric conversion factor of all specimens, respectively. And the marks "○", "Δ" and "x" in the lines of "Short-circuit Current" and "Open Voltage" after light degradation tests denote the short-circuit current and open voltage variation of lower than 5%, of 5% or higher but lower than 10%, and of 10% or higher in comparison with the short-circuit current and open voltage before light degradation tests, respectively.

TABLE 14

| Heating Temperature [° C./sec] | 50 | 80 | 100 | 200 | 300 | 400 | 450 | 500 |
|---|---|---|---|---|---|---|---|---|
| Initial Photoelectric Conversion Factor | x | ○ | ○ | ○ | ○ | ○ | Δ | x |
| Short-circuit Current | x | Δ | ○ | ○ | ○ | ○ | Δ | x |
| Open Voltage | x | x | ○ | ○ | ○ | ○ | x | x |

From the evaluation results of photoelectric conversion factor, short-circuit current and open voltage shown in Table 14, it is found that the heating temperature after forming the metal layer is suitably in the range of 100° C. to 400° C.

EXAMPLE 8

In this example, a metal layer 101 and a metal oxide layer 102 as shown in FIG. 1 were formed on a supporting member in the same manner as in example 1, except that a light reflection layer consisting of a metal layer and a metal oxide layer was formed on a supporting member using argon gas, as supporting member cooling gas, instead of helium gas. Hereinafter the light reflection layer formed on the supporting member will be referred to as "SE8".

REFERENCE EXAMPLE 8-1

In this example, a light reflection layer (SCR8-1) was formed on a supporting member in the same manner as in Example 8, except that a ZnO metal oxide layer 102 was formed after forming an Ag metal layer 101 without subjecting its supporting member to heat treatment.

Four light reflection layers were formed for each of the two types layers (SE8) and (SR8-1) as described above. Table 15 shows the evaluation results of the total reflectance and irregular reflectance of each light reflection layer obtained by measuring the light reflectance thereof. The method of evaluation was the same as in Example 1.

TABLE 15

| Specimen | Total Reflectance | Irregular Reflectance |
|---|---|---|
| (SE8) | 1.00 | 1.00 |
| (SR8-1) | 0.88 | 0.75 |

The results in Table 15 show that the light reflection layer (SE8) of Example 8 is superior to the light reflection layer (SR8-1) of Reference Example 8-1 in every evaluation results.

EXAMPLE 9

In this example, a metal layer 101 and a metal oxide layer 102 as shown in FIG. 1 were formed on a supporting member in the same manner as in example 1, except that the metal oxide layer was formed after subjecting the metal layer formed on the supporting member to heat treatment using hydrogen gas, as atmospheric gas, instead of helium gas. Hereinafter the light reflection layer formed on the supporting member will be referred to as "SE9".

REFERENCE EXAMPLE 9-1

In this example, a light reflection layer (SR9-1) was formed on a supporting member in the same manner as in Example 9, except that a ZnO metal oxide layer 102 was formed after forming an Ag metal layer 101 without subjecting its supporting member to heat treatment.

Four light reflection layers were formed for each of the two types layers (SE9) and (SR9-1). Table 16 shows the evaluation results of the total reflectance and irregular reflectance of each light reflection layer obtained by measuring the light reflectance thereof. The method of evaluation was the same as in Example 1.

TABLE 16

| Specimen | Total Reflectance | Irregular Reflectance |
|---|---|---|
| (SE9) | 1.00 | 1.00 |
| (SR9-1) | 0.85 | 0.74 |

The results in Table 16 show that the light reflection layer (SE9) of Example 9 is superior to the light reflection layer (SR9-1) of Reference Example 9-1 in every evaluation results.

As described above, according to the present invention, a method of forming a photovoltaic element is obtained which can prevent a defect from appearing in a light reflection layer of the element. As a result, the light reflection layer is allowed to have a discontinuous surface geometry with irregularities by combining a metal layer and a metal oxide layer, which ensures a high optical confinement effect, and hence a high reflectance of the light reflection layer. And a photovoltaic element of high photoelectric conversion factor can be obtained by forming a semiconductor layer on such a metal layer and a metal oxide layer.

What is claimed is:

1. A method of forming a photovoltaic element comprising:

(a) depositing a metal layer on a supporting member;

(b) heat-treating said metal layer on said supporting member;

(c) depositing a metal oxide layer on a surface of said heat-treated metal layer to form a substrate; and, (d) arranging at least one or more pin structures on said substrate, wherein each of said pin structures is formed by stacking n-type, i-type, and p-type silicon-containing non-single-crystalline semiconductor layers on said substrate.

2. The method of forming a photovoltaic element according to claim 1, wherein said heat treatment step is a step in which cooling treatment, heating treatment and cooling treatment are conducted once or repeated plural times in this order.

3. The method of forming a photovoltaic element according to claim 2, wherein the temperature decreasing speed of the supporting member in said cooling treatment is 1° C./sec or higher and 50° C./sec or lower.

4. The method of forming a photovoltaic element according to claim 2, wherein the temperature increasing speed of the supporting member in said heating treatment is 10° C./sec or higher and 100° C./sec or lower.

5. The method of forming a photovoltaic element according to claim 2, wherein the temperature for heating the supporting member in said heating treatment is 100° C. or higher and 400° C. or lower.

6. The method of forming a photovoltaic element according to claim 1, wherein said metal layer is composed of one metal selected from the group consisting of Ag, Au, Pt, Ni, Cr, Cu, Al, Ti, Zn, Mo and W, or an alloy thereof.

7. The method of forming a photovoltaic element according to claim 1, wherein said metal oxide layer is composed of one metal oxide selected from the group consisting of $SnO_2$, $In_3O_2$, ZnO, CdO, $Cd_2Sn_4$ and ITO ($In_2O_3+SnO_2$).

8. The method of forming a photovoltaic element according to claim 1, wherein an atmospheric gas used in said heat treatment step is at least one or more gases selected from the group of hydrogen gas, helium gas and argon gas.

* * * * *

UNITED STATES PATENT AND TRADEMARK OFFICE
CERTIFICATE OF CORRECTION

PATENT NO.    : 6,413,794 B1
DATED         : July 2, 2002
INVENTOR(S)   : Hitomi Sano et al.

It is certified that error appears in the above-identified patent and that said Letters Patent is hereby corrected as shown below:

Column 1,
Line 36, "laid-Open" should read -- Laid-Open --; and
Line 64, "instance" should read -- instant --.

Column 3,
Line 57, "order. The" should read -- order. ¶ The --.

Column 4,
Line 58, "for" should be deleted; and
Line 67, "layers." should read -- layer. --.

Column 5,
Line 10, "306" should read -- 306. --;
Line 17, "$3X10^{-4}$" should read -- $3X10^{-6}$ --;
Line 27, "steal" should read -- steel --;
Line 41, "member" should read -- member are --;
Line 58, "Is" should read -- is --; and
Line 61, "member" should read -- member are --.

Column 6,
Line 40, "is." should read -- is --; and
Line 62, "eta." should read -- etc. --.

Column 7,
Line 20, "camber" should read -- chamber --;
Line 21, "camber" should read -- chamber --; and
Line 45, "(f/i)" should read -- (n/i) --.

Column 8,
Line 29, "Its" should read -- its --; and
Line 49, "when" should read -- When --.

Column 10,
Line 15, "$_{SiHCl3}$," Should read -- $SiHCl_3$, --.

Column 11,
Line 49, "0-5 mm" should read -- 0.5 mm --.

UNITED STATES PATENT AND TRADEMARK OFFICE
CERTIFICATE OF CORRECTION

PATENT NO. : 6,413,794 B1
DATED : July 2, 2002
INVENTOR(S) : Hitomi Sano et al.

It is certified that error appears in the above-identified patent and that said Letters Patent is hereby corrected as shown below:

Column 12,
Line 22, "lower" should read -- lower. --.

Column 13,
Line 13, "In" should read -- in --.

Column 14,
Line 12, "results." should read -- result. --.

Column 15,
Line 12, "measure" should read -- measuring --;
Line 27, "results." should read -- result. --; and
Line 30, "type·photovoltaic" should read -- type photovoltaic --.

Column 16,
Line 11, "and" should read -- and in --; and
Line 34, "Inven" should read -- inven --.

Column 17,
Table 5, "$\underline{PH_2/H_2}$" should read --$\underline{PH_2/FH_2}$ --; and
$\qquad$ 50 $\qquad\qquad\qquad$ 60
Table 5, "RF
 1-type layer" should read -- RF
 $\qquad\qquad\qquad\qquad$ i-type layer --;
Line 58, "an" should read -- a --.

Column 18,
Line 59, "results." should read -- result --.

Column 19,
Line 48, "and" should read -- and in --.

UNITED STATES PATENT AND TRADEMARK OFFICE
CERTIFICATE OF CORRECTION

PATENT NO. : 6,413,794 B1
DATED : July 2, 2002
INVENTOR(S) : Hitomi Sano et al.

It is certified that error appears in the above-identified patent and that said Letters Patent is hereby corrected as shown below:

Column 22,
Line 41, "layers" should read -- layer --; and
Line 42, "As" should be deleted.

Column 23,
Line 46, "3 In"should read -- 3. In --;
Line 56, "than 5%" should read -- than 5%, --; and "10%" should read -- 10%, --.

Column 27,
Line 19, "results." should read -- result. --.

Signed and Sealed this

Twenty-second Day of April, 2003

JAMES E. ROGAN
*Director of the United States Patent and Trademark Office*